US009472584B2

(12) United States Patent
Negoro et al.

(10) Patent No.: US 9,472,584 B2
(45) Date of Patent: Oct. 18, 2016

(54) PHOTOTRANSISTOR AND SEMICONDUCTOR DEVICE

(71) Applicants: Takaaki Negoro, Osaka (JP); Yoshihiko Miki, Osaka (JP); Katsuyuki Sakurano, Hyogo (JP); Keiji Tsuda, Hyogo (JP); Hirofumi Watanabe, Hyogo (JP)

(72) Inventors: Takaaki Negoro, Osaka (JP); Yoshihiko Miki, Osaka (JP); Katsuyuki Sakurano, Hyogo (JP); Keiji Tsuda, Hyogo (JP); Hirofumi Watanabe, Hyogo (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 14/604,825

(22) Filed: Jan. 26, 2015

(65) Prior Publication Data

US 2015/0214413 A1 Jul. 30, 2015

(30) Foreign Application Priority Data

Jan. 27, 2014 (JP) ................................. 2014-012762

(51) Int. Cl.
*H01L 31/101* (2006.01)
*H01L 27/144* (2006.01)
*H01L 31/02* (2006.01)
*H01L 27/146* (2006.01)

(52) U.S. Cl.
CPC ..... *H01L 27/1443* (2013.01); *H01L 31/02019* (2013.01); *H01L 27/14681* (2013.01)

(58) Field of Classification Search
CPC .. H01L 31/08–31/1013; H01L 31/11–31/113; H01L 27/144; H01L 27/082; H01L 27/14681; H01L 27/1443

See application file for complete search history.

(56) References Cited

U.S. PATENT DOCUMENTS

| 4,107,721 | A | * | 8/1978 | Miller ................... H01L 31/111 257/462 |
| 4,270,135 | A | | 5/1981 | Schlegel et al. |
| 4,524,375 | A | * | 6/1985 | Baumgartner ...... H01L 27/1443 257/435 |
| 5,466,954 | A | * | 11/1995 | Aizpuru .............. H01L 31/1105 257/187 |
| 5,656,841 | A | | 8/1997 | Watanabe et al. |
| 5,825,673 | A | | 10/1998 | Watanabe |
| 6,075,404 | A | | 6/2000 | Shindoh et al. |
| 6,271,730 | B1 | | 8/2001 | Abe et al. |
| 6,437,550 | B2 | | 8/2002 | Andoh et al. |
| 7,262,447 | B2 | | 8/2007 | Negoro et al. |
| 7,368,715 | B2 | | 5/2008 | Watanabe |
| 7,425,753 | B2 | | 9/2008 | Kato et al. |

(Continued)

FOREIGN PATENT DOCUMENTS

| JP | 62-044822 | 9/1987 |
| JP | 62-044824 | 9/1987 |
| JP | 2013-187527 | 9/2013 |

OTHER PUBLICATIONS

U.S. Appl. No. 07/550,154, filed Jul. 9, 1990.

*Primary Examiner* — Cuong B Nguyen
(74) *Attorney, Agent, or Firm* — Cooper & Dunham LLP

(57) ABSTRACT

A phototransistor includes a first emitter region, a first base region having at least a portion exposed to a light-receiving side, and a first collector region in this order from the light-receiving side in a depth direction. The first collector region includes a second collector region and a third collector region that is in contact with a downstream side of the second collector region in the depth direction and has a resistance lower than that of the second collector region. The phototransistor further includes a first region that is spaced away from the first base region at an outer side of the first base region on a light-receiving side surface thereof, the first region having a conductivity type opposite to that of the first collector region.

10 Claims, 10 Drawing Sheets

(56) References Cited

U.S. PATENT DOCUMENTS

| | | |
|---|---|---|
| 7,426,146 B2 | 9/2008 | Aota et al. |
| 7,735,375 B2 | 6/2010 | Ueda et al. |
| 8,169,039 B2 | 5/2012 | Negoro |
| 8,174,319 B2 | 5/2012 | Aota et al. |
| 8,759,772 B2 | 6/2014 | Noguchi et al. |
| 8,772,722 B2 | 7/2014 | Noguchi et al. |
| 2002/0024114 A1* | 2/2002 | Sakamoto ........... H01L 27/0761 257/565 |
| 2003/0001206 A1 | 1/2003 | Negoro et al. |
| 2003/0197552 A1 | 10/2003 | Watanabe |
| 2003/0214336 A1 | 11/2003 | Watanabe |
| 2004/0004992 A1 | 1/2004 | Aota et al. |
| 2004/0227183 A1 | 11/2004 | Negoro et al. |
| 2005/0017297 A1 | 1/2005 | Shimizu et al. |
| 2005/0218478 A1 | 10/2005 | Watanabe |
| 2006/0138546 A1 | 6/2006 | Negoro et al. |
| 2006/0152284 A1 | 7/2006 | Morino |
| 2006/0197581 A1 | 9/2006 | Chun et al. |
| 2007/0109039 A1 | 5/2007 | Watanabe |
| 2007/0188216 A1 | 8/2007 | Negoro |
| 2008/0012543 A1 | 1/2008 | Negoro |
| 2008/0100276 A1 | 5/2008 | Negoro |
| 2009/0033420 A1 | 2/2009 | Negoro |
| 2011/0185326 A1 | 7/2011 | Ueda et al. |
| 2012/0013383 A1 | 1/2012 | Negoro et al. |
| 2012/0032733 A1 | 2/2012 | Negoro |
| 2013/0127504 A1 | 5/2013 | Hayashi et al. |
| 2013/0187030 A1 | 7/2013 | Hayashi et al. |
| 2013/0234277 A1 | 9/2013 | Negoro et al. |
| 2013/0240716 A1 | 9/2013 | Hayashi et al. |
| 2014/0079458 A1 | 3/2014 | Seto et al. |
| 2014/0239158 A1 | 8/2014 | Hayashi et al. |
| 2014/0367550 A1 | 12/2014 | Aisu et al. |

* cited by examiner

| LIGHT-RECEIVING AREA [mm²] | PHOTOELECTRIC CURRENT [μA] | | |
|---|---|---|---|
| | EXAMPLE 2 | EXAMPLE 1 | COMPARATIVE EXAMPLE 1 |
| 0.25 | 7.05 | 0.048 | 0.29 |
| 1 | 31.9 | 0.213 | 0.602 |
| 2.25 | 72.6 | 0.453 | 0.912 |
| R-2 VALUE OF APPROXIMATE CURVE | 1 | 0.998 | 0.979 |

PHOTOTRANSISTOR AND SEMICONDUCTOR DEVICE

CROSS-REFERENCE TO RELATED APPLICATION

The present application claims priority to and incorporates by reference the entire contents of Japanese Patent Application No. 2014-012762 filed in Japan on Jan. 27, 2014.

BACKGROUND OF THE INVENTION

1. Field of the Invention

The present invention relates to a phototransistor and a semiconductor device.

2. Description of the Related Art

A phototransistor of which the sensor can amplify a photoelectric current generated by p-n junction because of its bipolar structure, and is used as a highly-sensitive photodetector. For example, the phototransistor is used in a sensor that measures the smoothness of a recording medium such as a sheet of paper. Specifically, the recording medium is irradiated with light by a light source such as an LED, and the phototransistor receives a weak reflected light from the recording medium thereby outputting a photoelectric current, and the smoothness is measured on the basis of the photoelectric current.

Furthermore, conventionally, there has been disclosed a technology to form an extremely-small emitter region, thereby improving the frequency response of a bipolar transistor or a phototransistor.

However, a conventional phototransistor may fail to accurately output a photoelectric current if only a part of a light-receiving region of the phototransistor is irradiated with light.

Therefore, there is a need to provide a phototransistor and semiconductor device capable of outputting a photoelectric current with high accuracy.

SUMMARY OF THE INVENTION

It is an object of the present invention to at least partially solve the problems in the conventional technology.

According to an embodiment, there is provided a phototransistor that includes a first emitter region, a first base region having at least a portion exposed to a light-receiving side, and a first collector region in this order from the light-receiving side in a depth direction. The first collector region includes a second collector region and a third collector region that is in contact with a downstream side of the second collector region in the depth direction and has a resistance lower than that of the second collector region. The phototransistor further includes a first region that is spaced away from the first base region at an outer side of the first base region on a light-receiving side surface thereof, the first region having a conductivity type opposite to that of the first collector region.

According to another embodiment, there is provided a semiconductor device that includes the phototransistor according to the above embodiment.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Exemplary embodiments of a phototransistor and semiconductor device according to the present invention will be explained in detail below with reference to accompanying drawings.

First Embodiment

Figure 1A:
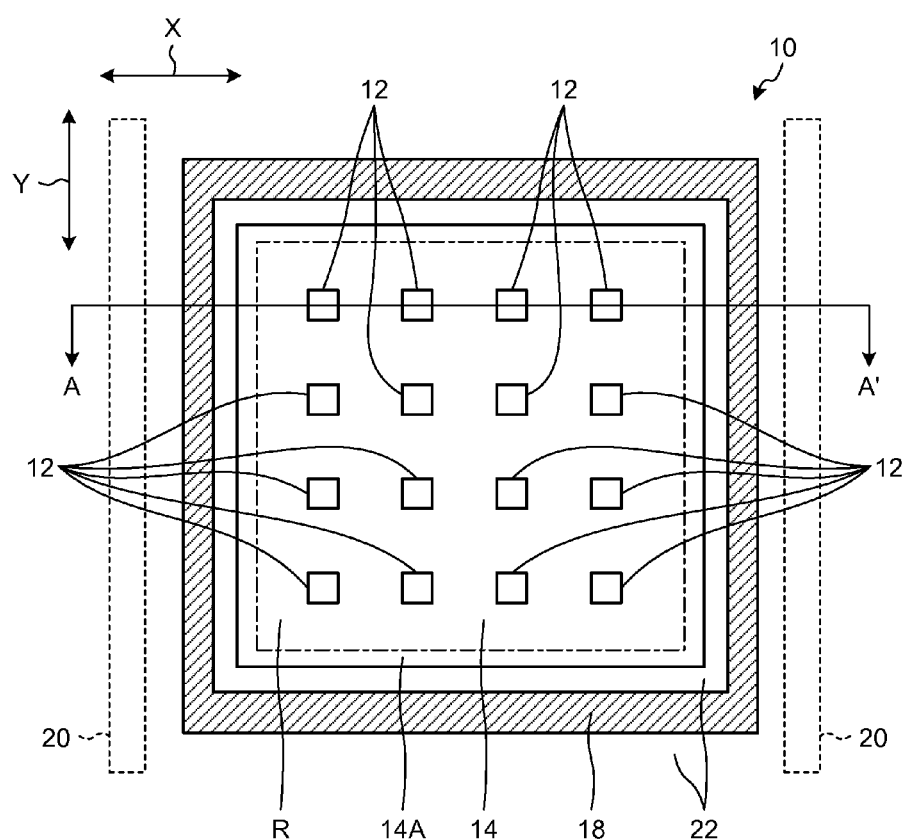
FIGS. 1A and 1B are explanatory diagrams of a phototransistor according to a first embodiment.
Figure 1B:
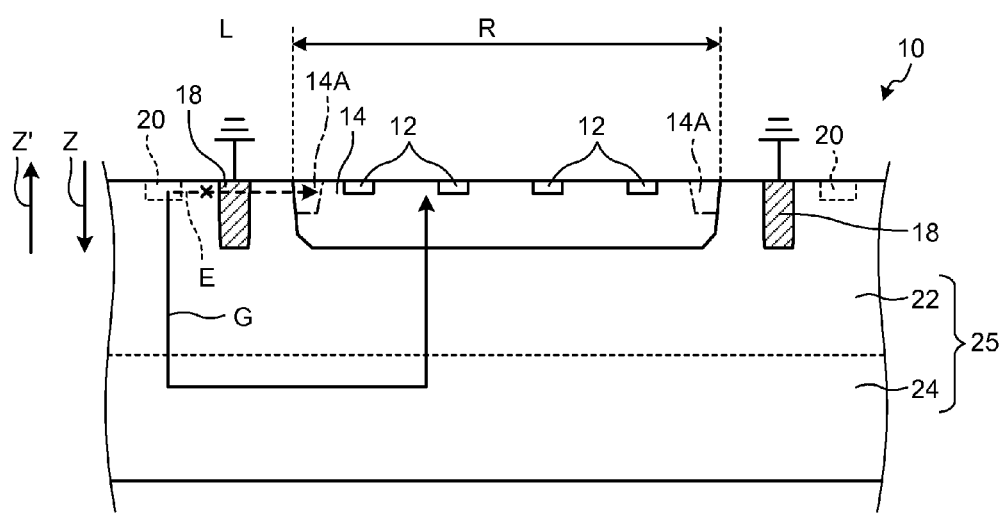

FIGS. 1A and 1B are explanatory diagrams of a phototransistor 10 according to a first embodiment. FIG. 1A is a plan view of the phototransistor 10 viewed from the light-receiving side (see a reference numeral L in FIG. 1B; hereinafter, referred to as the light-receiving side L). FIG. 1B is a cross-sectional view of the phototransistor 10 along the line A-A' in FIG. 1A.

As illustrated in FIG. 1B, the phototransistor 10 according to the present embodiment has a first emitter region 12, a first base region 14, and a first collector region 25 in order from the light-receiving side L to a depth direction (see a direction of arrow Z in FIG. 1; hereinafter, referred to as depth direction Z). That is, the phototransistor 10 is a vertical bipolar phototransistor.

At least a part of the first base region 14 is exposed to the light-receiving side L. Then, the exposed part of the first base region 14 is a light-receiving region R where the first base region 14 receives light.

The first emitter region 12 is a region that serves as an emitter of the phototransistor. In the present embodiment, the first emitter region 12 is composed of an N+ type semiconductor.

As illustrated in FIG. 1A, in the present embodiment, multiple first emitter regions 12 are arranged within the first base region 14 at intervals along the surface of the phototransistor 10 on the light-receiving side L. Here, two axes perpendicular to each other along the surface on the light-receiving side L are described as an X-axis direction (see an arrow X in FIG. 1) and a Y-axis direction (see an arrow Y in FIG. 1). The X-axis direction and the Y-axis direction are perpendicular to the depth direction Z.

In FIG. 1A, there is described a case where a total of 16 first emitter regions 12 are arranged in a 4×4 matrix at intervals along the X-axis direction and the Y-axis direction. However, the number of first emitter regions 12 arranged within the first base region 14 of the phototransistor 10 is not limited to 16.

The present invention is not limited to the configuration in which multiple first emitter regions 12 are arranged within the first base region 14 at intervals. However, it is preferable that multiple first emitter regions 12 are arranged on the surface of the first base region 14 on the light-receiving side L at intervals.

As described above, at least a part of the first base region 14 is exposed to the light-receiving side L. Therefore, it is preferable that the first emitter regions 12 are scattered on the first base region 14 on the light-receiving side L so as not to cover the whole first base region 14.

In the present embodiment, the first base region 14 is composed of a P type semiconductor. It is preferable that a P+ type base region 14A be placed in an area on the surface of the first base region 14 on the light-receiving side L at a predetermined space from the outer boundary of the first base region 14 toward the inside of the first base region 14.

The first collector region 25 is composed of an N type semiconductor. The first collector region 25 includes a second collector region 22 and a third collector region 24. The third collector region 24 is placed to be in abutting contact with the downstream side of the second collector region 22 in the depth direction Z.

The third collector region 24 is a collector region which is lower in resistance than the second collector region 22. In the present embodiment, the second collector region 22 is composed of an N− type semiconductor. The third collector region 24 is composed of an N+ type semiconductor.

The third collector region 24 adjusts the concentration of an N-type impurity, such as phosphorus, to a higher concentration than that in the second collector region 22, thereby becoming an N+ type collector region having a lower resistance than the second collector region 22.

In this manner, the phototransistor 10 according to the present embodiment has an NPN-type vertical bipolar structure of the N+ type first emitter regions 12, the P type first base region 14, and the N type first collector region 25.

The phototransistor 10 according to the present embodiment further has a first region 18.

The first region 18 is placed at the outer side of the first base region 14 on the surface of the phototransistor 10 on the light-receiving side L at a space from the first base region 14. In the present embodiment, there is described a case where the first region 18 is placed at the outer side of the first base region 14 on the surface of the phototransistor 10 on the light-receiving side L at a space from the first base region 14 so as to surround the first base region 14 (see FIG. 1A).

However, it is only necessary to place the first region 18 at the outer side of the first base region 14 on the surface of the phototransistor 10 on the light-receiving side L at a space from the first base region 14. That is, a configuration of the first region 18 is not limited to be placed on the surface on the light-receiving side L so as to surround the first base region 14. For example, multiple first regions 18 can be placed at positions spaced from the first base region 14 at the outer side of the first base region 14 on the surface of the phototransistor 10 on the light-receiving side L at predetermined intervals along the X-axis direction and the Y-axis direction.

The first region 18 is a region whose conductivity type is opposite to that of the first collector region 25.

In the present embodiment, as described above, the first collector region 25 is composed of an N type semiconductor. Therefore, in the present embodiment, the first region 18 is composed of a P type semiconductor whose conductivity type is opposite to the N type.

The first region 18 and the first base region 14 are placed at a space, and are electrically separated from each other.

Furthermore, the first region 18 is grounded (see FIG. 1B). Therefore, the first region 18 is fixed at reference voltage. That is, the first region 18 is placed and grounded, thereby a depletion layer is formed between the first region 18 and a collector contact region 20.

It is preferable that the length of the first region 18 in the depth direction Z be equal to or more than the length of the first base region 14 in the depth direction Z and the length of the collector contact region 20 in the depth direction Z and is less than the length of the second collector region 22 in the depth direction Z.

The width (the minimum length in a direction intersecting the depth direction Z) of the first region 18 only has to be long enough to prevent electric current flowing between the collector contact region 20 and the first emitter regions 12 from flowing in a direction perpendicular to the depth direction Z through the first region 18. Therefore, it is only necessary to appropriately adjust the width of the first region 18 according to the configuration of the phototransistor 10.

The collector contact region 20 is placed at the outer side of the first region 18 on the surface of the phototransistor 10 on the light-receiving side L at a space from the first region 18. The collector contact region 20 is electrically connected to the first collector region 25. The collector contact region 20 is composed of an N+ type semiconductor.

Regarding the phototransistor 10 configured as illustrated in FIGS. 1A and 1B, bias voltage is applied to the collector contact region 20, thereby voltage is applied between the collector contact region 20 and the first emitter regions 12.

Here, the first region 18 is grounded, so a depletion layer is formed between the first region 18 and the collector contact region 20. Therefore, the electrical distance between the collector contact region 20 and the first base region 14 becomes greater as compared with the case where the first region 18 is not provided.

Therefore, a current generated by the application of voltage to the collector contact region 20 flows through the collector contact region 20, the third collector region 24, and the second collector region 22 in this order toward the first emitter regions 12 through the first base region 14.

Here, the second collector region 22 having a higher resistance than the third collector region 24 is placed on the light-receiving side L of the third collector region 24. Therefore, the current generated by the voltage applied to the collector contact region 20 is diffused over the whole area of the third collector region 24 in the direction intersecting the depth direction Z of the first base region 14, and then the flow of the current is restricted in the high-resistance second collector region 22, and after that, the current reaches the first base region 14 and the first emitter regions 12. Therefore, the current generated by the voltage applied to the collector contact region 20 becomes a path in a counter-depth direction Z′ toward the whole area of the first base region 14 through the third collector region 24 and the second collector region 22. Specifically, a path through which the current generated by the voltage applied to the collector contact region 20 flows is a path along a direction of arrow G illustrated in FIG. 1B.

Furthermore, the first region 18, which serves as a depletion layer, is provided in the phototransistor 10; therefore, the formation of a current path from the collector contact region 20 toward the first base region 14 and the first emitter regions 12 through the first region 18 in the direction intersecting the depth direction Z (see a direction of arrow E in FIG. 1B) is inhibited. Moreover, the first region 18 generates a depletion layer; therefore, the operation of a bipolar transistor in the direction of arrow E caused by the collector contact region 20 composed of an N+ type semiconductor, the first region 18 composed of a P type semiconductor, and the first emitter regions 12 composed of N+ type semiconductors is suppressed.

Therefore, the phototransistor 10 becomes in a fit state to generate photoelectric current uniformly over the whole area of the light-receiving region R, which is a portion of the first base region 14 exposed to the light-receiving side L.

Accordingly, in this state, when the light-receiving region R has received a light, a portion of the first base region 14 which has received the light can accurately output photoelectric current. That is, even when a light has been received by only a part of the light-receiving region R or a different part of the light-receiving region R, it is possible to accurately output photoelectric current.

As explained above, the phototransistor 10 according to the present embodiment is a vertical bipolar phototransistor having the first emitter regions 12, the first base region 14, and the first collector region 25 in order from the light-receiving side L to the depth direction Z. Then, the first collector region 25 includes the second collector region 22 and the third collector region 24 having a lower resistance than the second collector region 22. The third collector region 24 is placed to be in abutting contact with the downstream side of the second collector region 22 in the depth direction Z. The first region 18 is placed at the outer side of the first base region 14 on the light-receiving side surface of the phototransistor 10. The first region 18 is placed at the outer side of the first base region 14 on the light-receiving side surface at a space from the first base region 14.

Therefore, the phototransistor 10 can inhibit the formation of a current path between an outer region of the first base region 14 and the first emitter regions 12 on the light-receiving surface in the direction perpendicular to the depth direction Z. Furthermore, in the present embodiment, the phototransistor 10 can achieve current paths in the depth direction Z and the counter-depth direction Z' over the whole area of the first base region 14.

Consequently, in the phototransistor 10 according to the present embodiment, there is suppressed the occurrence of a difference in operation between the end part and central part of the light-receiving region R in the phototransistor 10.

Therefore, in the phototransistor 10 according to the present embodiment, even when a light has been received by only a part of the light-receiving region R or a different part of the light-receiving region R, it is possible to accurately output photoelectric current.

Furthermore, in the present embodiment, the first base region 14 composed of a P type semiconductor includes the P+ type base region 14A in an area on the surface of the first base region 14 on the light-receiving side L at a predetermined space from the outer boundary of the first base region 14 toward the inside of the first base region 14.

Therefore, it is possible to further suppress the operation of the bipolar transistor in the direction of arrow E caused by the collector contact region 20 composed of an N+ type semiconductor, the first region 18 composed of a P type semiconductor, and the first emitter regions 12 composed of N+ type semiconductors.

Moreover, the phototransistor 10 according to the present embodiment has the configuration in which the multiple first emitter regions 12 are scattered on the first base region 14 on the light-receiving side L. Therefore, the phototransistor 10 can reduce the capacitance of emitter-base junction between the first emitter regions 12 and the first base region 14 as compared with a configuration in which multiple first emitter regions 12 are not scattered.

Meanwhile, a conventional phototransistor cannot achieve accurate output of photoelectric current like the phototransistor 10 according to the present embodiment.

Figure 2A:
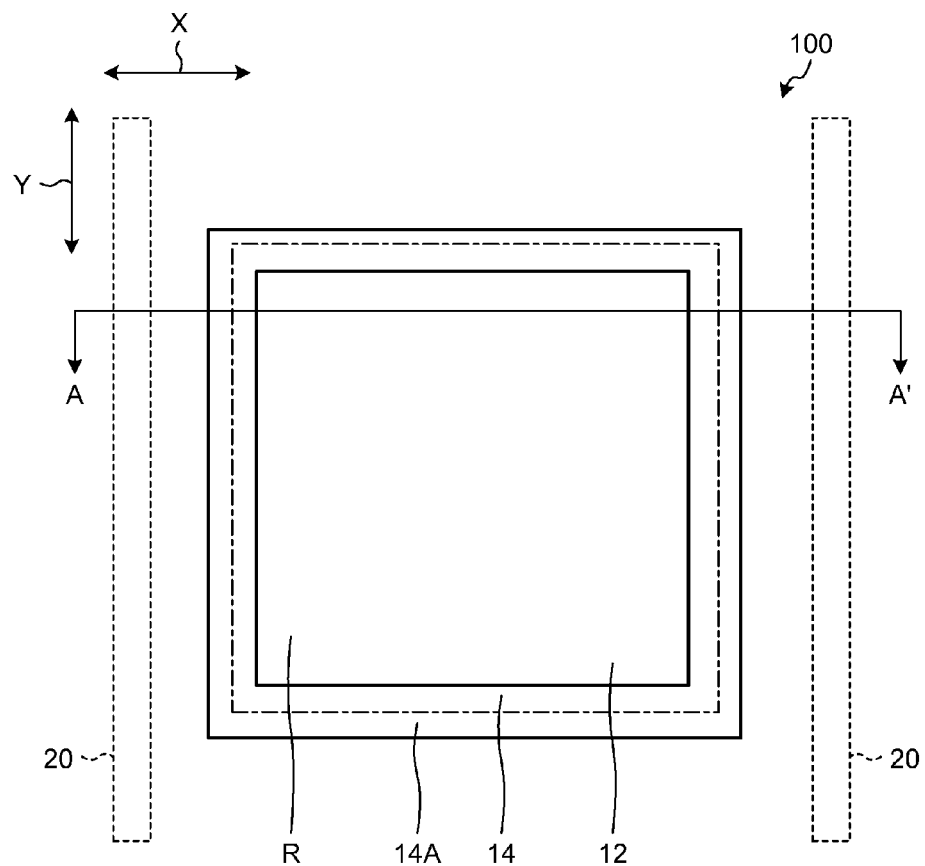
FIGS. 2A and 2B illustrate an example of a conventional phototransistor.
Figure 2B:
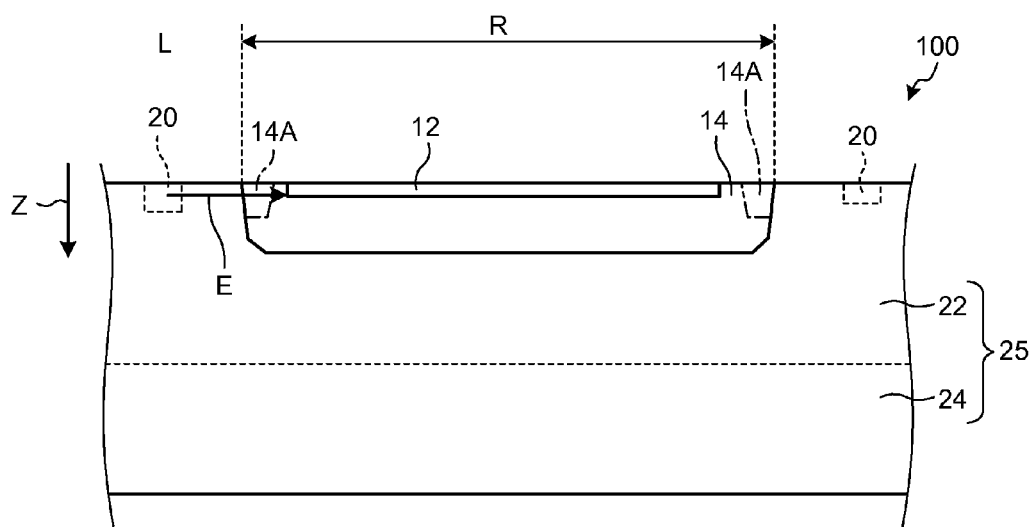

FIGS. 2A and 2B illustrate an example of a conventional phototransistor 100. FIG. 2A is a plan view of the conventional phototransistor 100 viewed from the light-receiving side L. FIG. 2B is a cross-sectional view of the conventional phototransistor 100 along the line A-A' in FIG. 2A.

The conventional phototransistor 100 is a vertical bipolar phototransistor having the first emitter region 12, the first base region 14, and the first collector region 25 in this order.

In the conventional phototransistor 100, instead of multiple first emitter regions 12 scattered on the first base region 14, one first emitter region 12 is placed in the center of the first base region 14 so that the end part of the first base region 14 is exposed to the light-receiving side L.

The conventional phototransistor 100 differs from the phototransistor 10 according to the present embodiment in that the conventional phototransistor 100 does not have the first region 18 in the phototransistor 10 according to the present embodiment, and multiple first emitter regions 12 are not arranged to be scattered on the first base region 14.

Figure 3A:
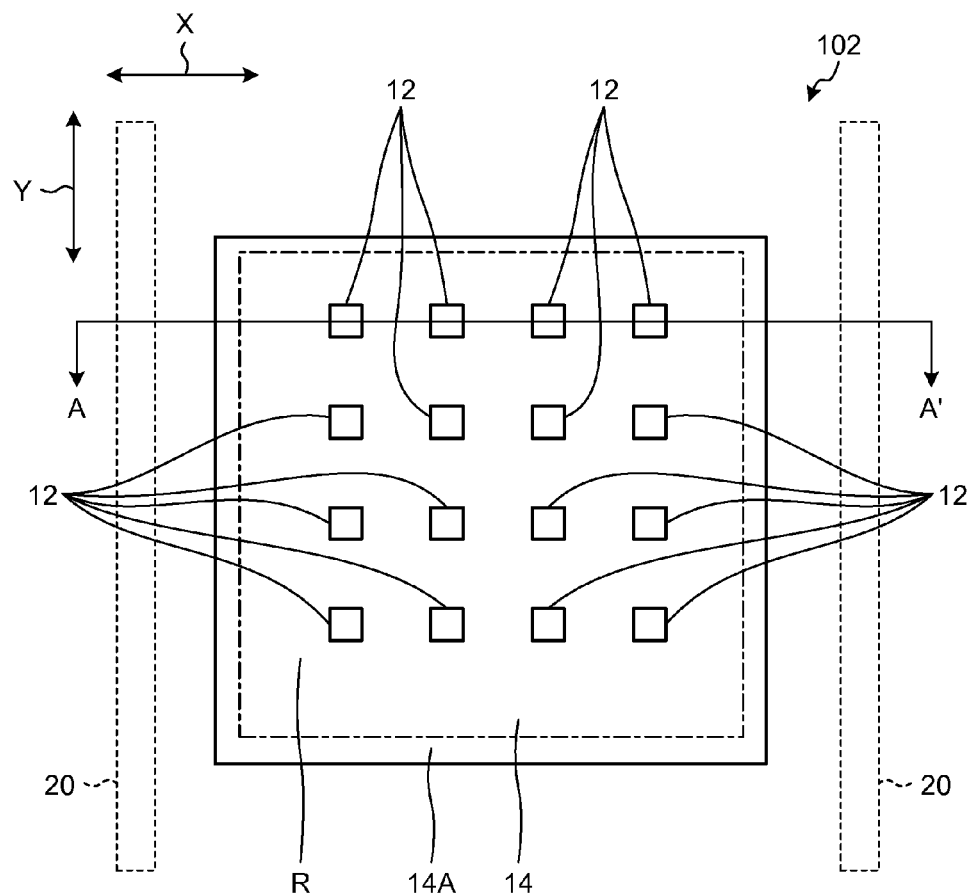
FIGS. 3A and 3B illustrate an example of a conventional phototransistor.
Figure 3B:
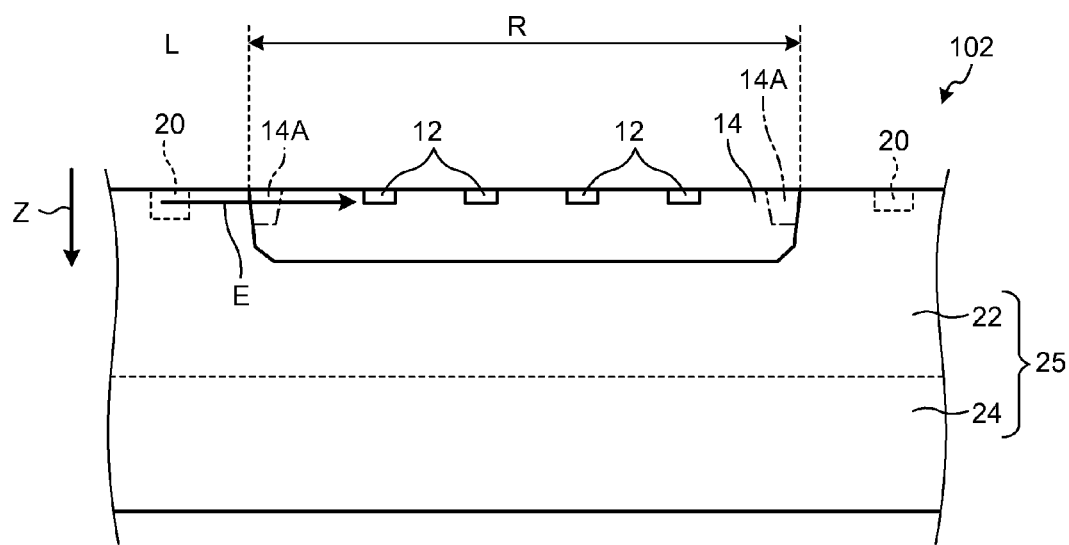

FIGS. 3A and 3B illustrate an example of a conventional phototransistor 102. FIG. 3A is a plan view of the conventional phototransistor 102 viewed from the light-receiving side L. FIG. 3B is a cross-sectional view of the conventional phototransistor 102 along the line A-A' in FIG. 3A.

The conventional phototransistor 102 is a vertical bipolar phototransistor having the first emitter regions 12, the first base region 14, and the first collector region 25 in this order.

The conventional phototransistor 102 differs from the phototransistor 10 according to the present embodiment in that the conventional phototransistor 102 does not have the first region 18 in the phototransistor 10 according to the present embodiment.

In the conventional phototransistors 100 and 102, the first region 18, which serves as a depletion layer, is not provided. Therefore, a current path from the collector contact region 20 toward the first base region 14 and the first emitter regions 12 in the direction intersecting the depth direction Z (see the direction of arrow E in FIGS. 2B and 3B) is formed.

Therefore, in the conventional phototransistors 100 and 102, it is difficult to generate photoelectric current uniformly over the whole area of the light-receiving region R, which is a portion of the first base region 14 exposed to the light-receiving side L. That is, in the conventional phototransistors 100 and 102, a difference in operation occurs between the end part and central part of the light-receiving region R.

On the other hand, in the phototransistor 10 according to the present embodiment, even when a light has been received by only a part of the light-receiving region R or a different part of the light-receiving region R, it is possible to accurately output photoelectric current.

Furthermore, in the phototransistor 10 according to the present embodiment, the first base region 14 composed of a P type semiconductor includes the P+ type base region 14A in an area on the surface of the first base region 14 on the light-receiving side L at a predetermined space from the outer boundary of the first base region 14 toward the inside of the first base region 14.

Therefore, it is possible to further suppress the operation of the bipolar transistor in the direction of arrow E caused by the collector contact region 20 composed of an N+ type semiconductor, the first region 18 composed of a P type semiconductor, and the first emitter regions 12 composed of N+ type semiconductors.

Moreover, the phototransistor 10 according to the present embodiment has the configuration in which the multiple first emitter regions 12 are scattered on the first base region 14 on the light-receiving side L. Therefore, the phototransistor 10 can reduce the capacitance of emitter-base junction between the first emitter regions 12 and the first base region 14 as compared with a configuration in which multiple first emitter regions 12 are not scattered.

Incidentally, in the present embodiment, there is described a case where the phototransistor 10 has an NPN-type vertical bipolar structure of the N+ type first emitter regions 12, the P type first base region 14, and the N type first collector region 25. Alternatively, the phototransistor 10 can have a PNP-type vertical bipolar structure.

In this case, it is only necessary to compose the first emitter regions 12 and the first collector region 25 of P type semiconductors and to compose the first base region 14 of an N type semiconductor. Furthermore, it is only necessary to compose the collector contact region 20 of a P type semiconductor and to compose the first region 18 of an N type semiconductor. However, in this case, the first region 18 needs to be a power supply voltage.

Second Embodiment

Figure 4A:
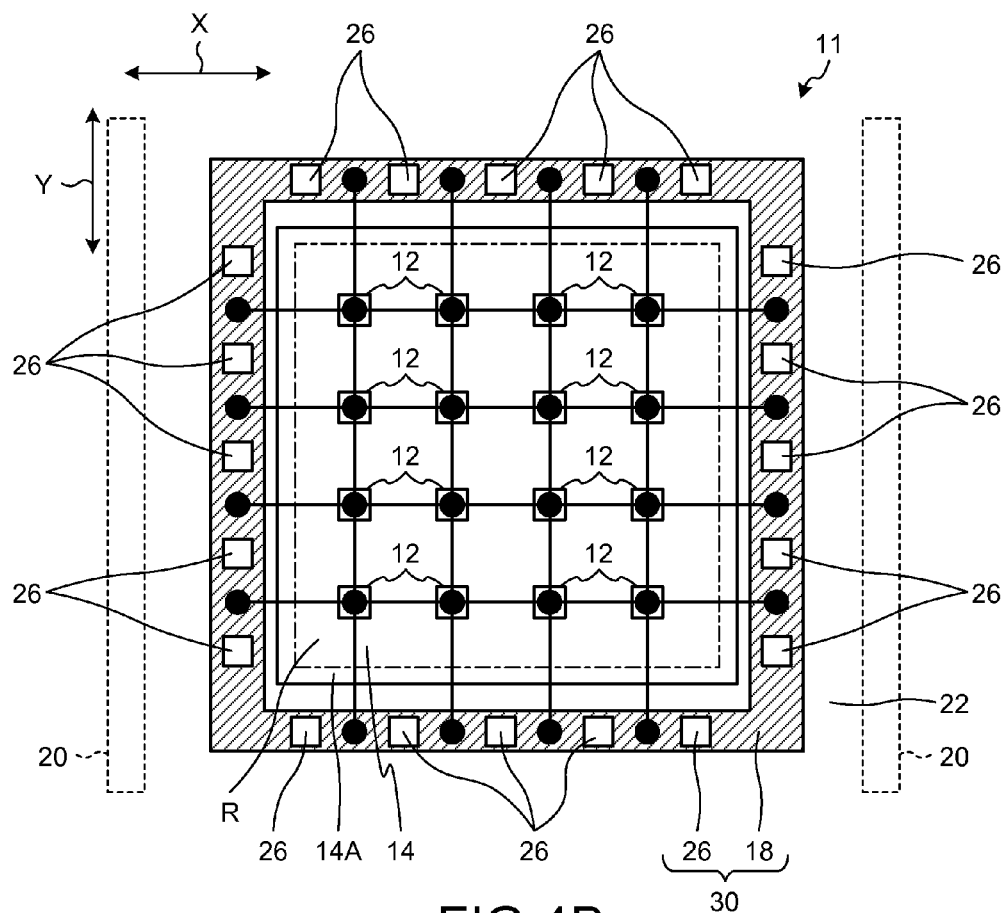
FIGS. 4A and 4B are explanatory diagrams of a phototransistor according to a second embodiment.
Figure 4B:
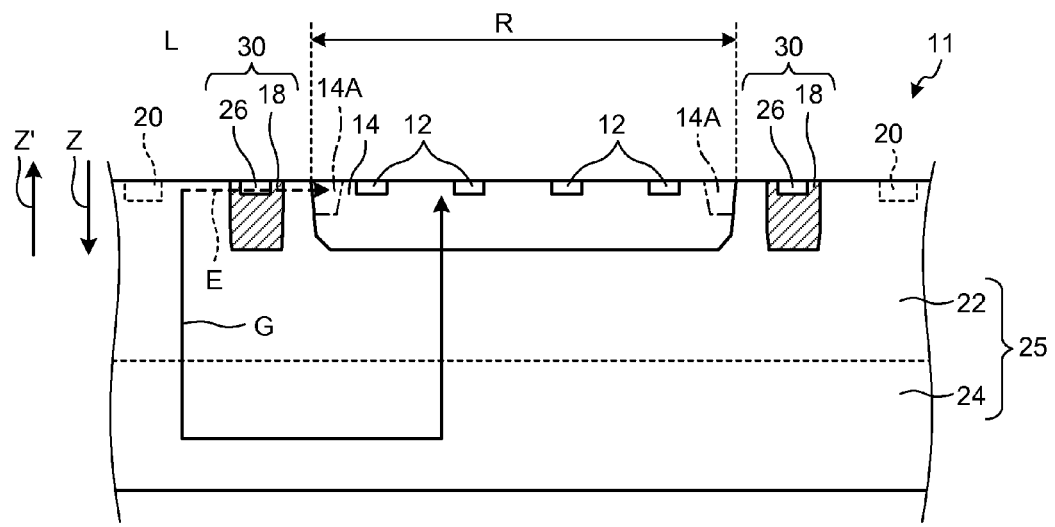

FIGS. 4A and 4B are explanatory diagrams of a phototransistor 11 according to a second embodiment.

FIG. 4A is a plan view of the phototransistor 11 viewed from the light-receiving side L. FIG. 4B is a cross-sectional view of the phototransistor 11 illustrated in FIG. 4A.

As illustrated in FIG. 4B, the phototransistor 11 according to the present embodiment has the first emitter regions 12, the first base region 14, and the first collector region 25 in order from the light-receiving side L to the depth direction Z. That is, the phototransistor 11 is a vertical bipolar phototransistor. Furthermore, the phototransistor 11 has the collector contact region 20 and a bipolar region 30.

Except that the phototransistor 11 has the bipolar region 30 instead of the first region 18, the phototransistor 11 has the same configuration as the phototransistor 10 according to the first embodiment.

The bipolar region 30 includes the first region 18 and second emitter regions 26. The first region 18 is identical to that in the phototransistor 10 according to the first embodiment. That is, the first region 18 is placed at the outer side of the first base region 14 on the surface of the phototransistor 11 on the light-receiving side L at a space from the first base region 14. In the present embodiment, there is described a case where the first region 18 is placed at the outer side of the first base region 14 on the surface of the phototransistor 10 on the light-receiving side L at a space from the first base region 14 so as to surround the first base region 14 (see FIG. 4A).

As with the first embodiment, the first region 18 is a region whose conductivity type is opposite to that of the first collector region 25. It is only necessary to place the first region 18 at the outer side of the first base region 14 on the surface of the phototransistor 11 on the light-receiving side L at a space from the first base region 14. That is, a configuration of the first region 18 is not limited to be placed on the surface on the light-receiving side L so as to surround the first base region 14. For example, multiple first regions 18 can be placed at positions spaced from the first base region 14 at the outer side of the first base region 14 on the surface of the phototransistor 10 on the light-receiving side L at predetermined intervals along the X-axis direction and the Y-axis direction.

The second emitter regions 26 are placed within the first region 18 on the surface on the light-receiving side L. The second emitter regions 26 are electrically separated from the first region 18. In the present embodiment, the second emitter regions 26 are composed of N type semiconductors.

Then, the phototransistor 11 according to the present embodiment adopts Darlington connection where the first emitter regions 12 and the first region 18 are connected, and the second emitter regions 26 output. That is, the phototransistor 11 has a configuration in which a transistor consisting of the second emitter regions 26 composed of N type semiconductors, the first region 18 composed of a P type semiconductor, and the first collector region 25 composed of an N type semiconductor and a transistor consisting of the first emitter regions 12, the first base region 14, and the first collector region 25 are connected in Darlington connection.

Therefore, besides the effect of the first embodiment, the phototransistor 11 according to the present embodiment can output greater photoelectric current even if the same quantity of light has been received on the same light-receiving area in a state the same level of voltage has been applied.

Third Embodiment

Figure 5A:
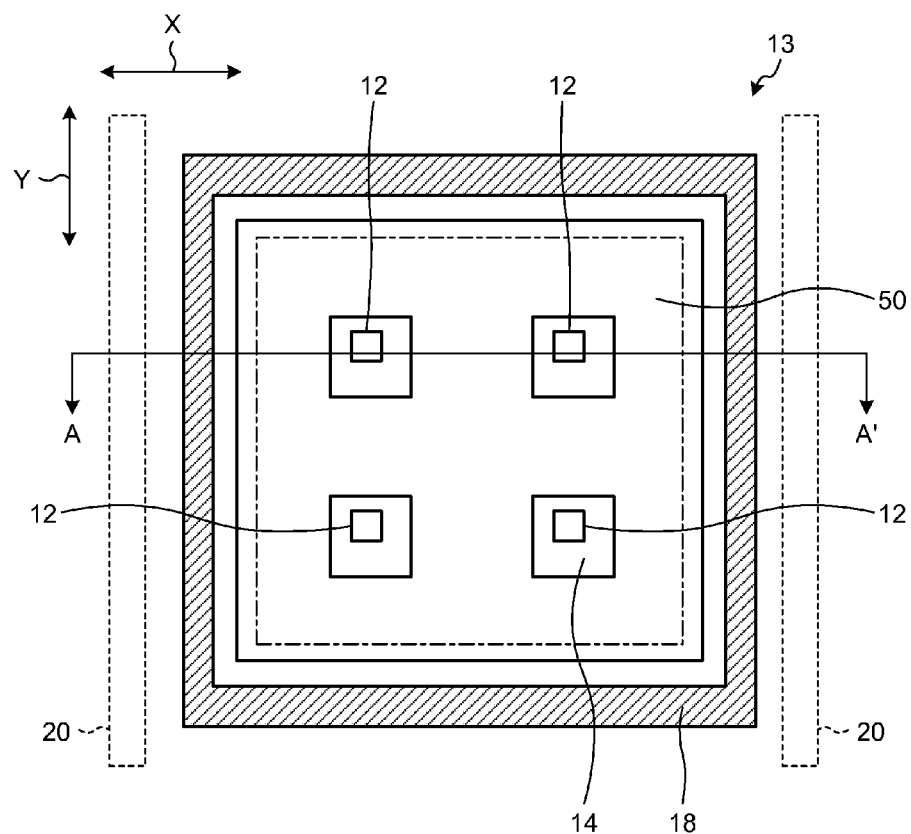
FIGS. 5A and 5B are explanatory diagrams of a phototransistor according to a third embodiment.
Figure 5B:
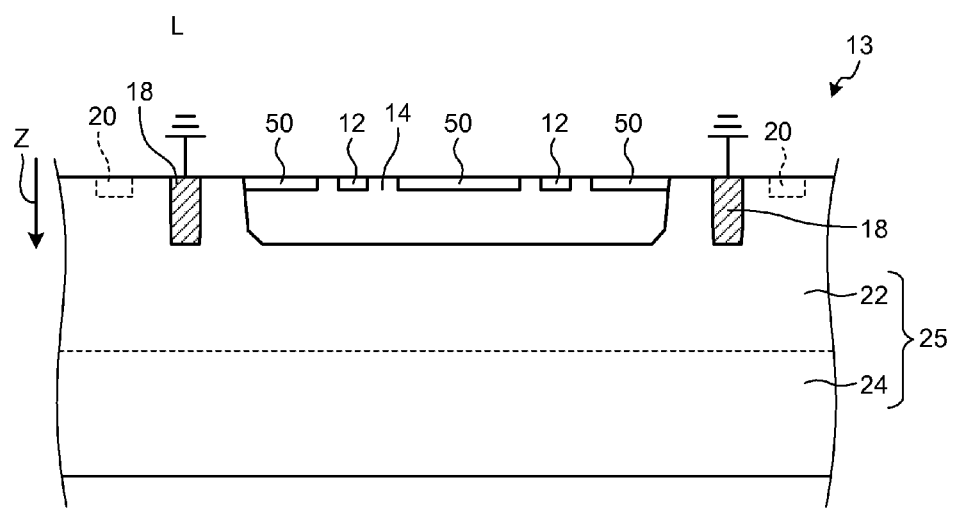

FIGS. 5A and 5B are explanatory diagrams of a phototransistor 13 according to a third embodiment.

FIG. 5A is a plan view of the phototransistor 13 viewed from the light-receiving side L. FIG. 5B is a cross-sectional view of the phototransistor 13 illustrated in FIG. 5A.

As illustrated in FIG. 5B, the phototransistor 13 according to the present embodiment has the first emitter regions 12, the first base region 14, and the first collector region 25 in order from the light-receiving side L to the depth direction Z. That is, the phototransistor 13 is a vertical bipolar phototransistor. Furthermore, the phototransistor 13 is configured to have a second base region 50 on the exposed part of the first base region 14.

The second base region 50 is spaced away from each of the multiple first emitter regions 12 so as to surround the scattered first emitter regions 12. The impurity concentration of the second base region 50 is more than ten times higher than that of the first base region 14. Furthermore, the second base region 50 are placed at a space from each of the multiple first emitter regions 12 so that junction leakage does not occur. The space can be about 1.0 μm.

Figure 6:
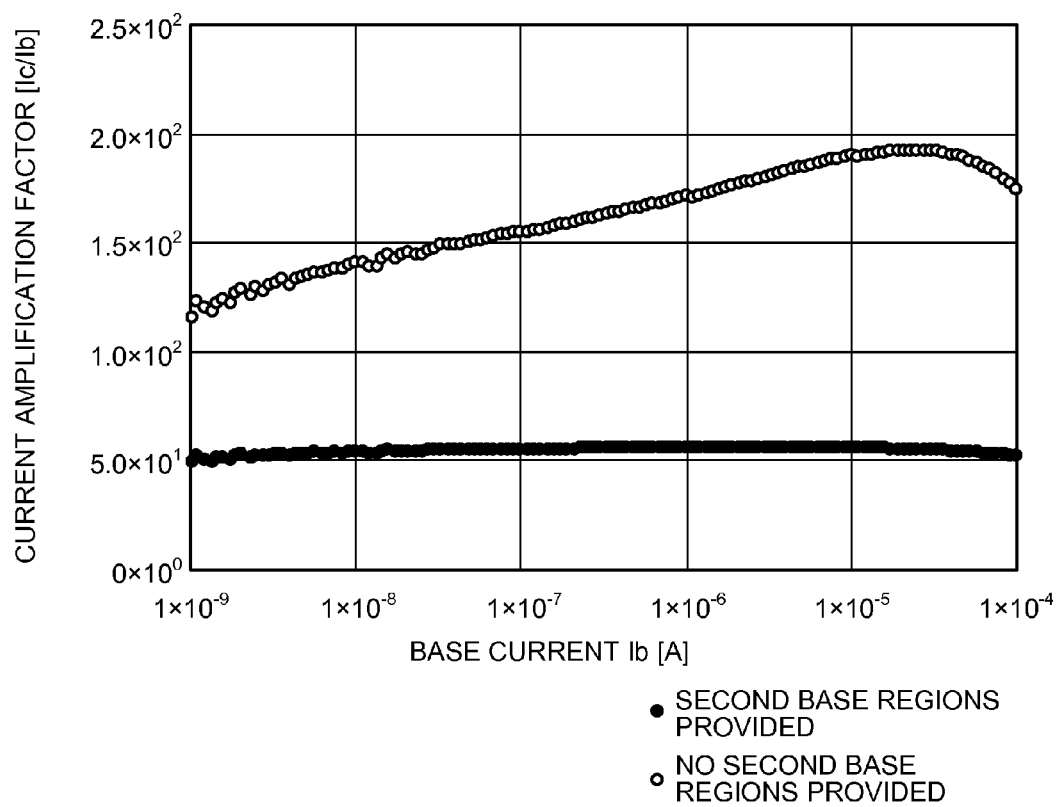
FIG. 6 illustrates a relationship between base current and current amplification factor in the structure of the phototransistor according to the third embodiment.

FIG. 6 illustrates the current amplification factor with respect to a base current when the phototransistor 13 according to the present embodiment works as a bipolar phototransistor. Applied voltage indicates the ratio of collector current to base current (the current amplification factor) based on the presence or absence of the second base region 50 when the collector current is 5 V, emitter voltage is grounded thereby varying the base current.

The base current here corresponds to a photoelectric current before amplification of current generated through PN junction in the phototransistor according to the present embodiment. By providing the second base region 50, the current amplification factor with respect to base current from a low current region to a high current region becomes constant, and therefore, an accurate photoelectric current can be obtained more stably. Furthermore, the current amplification factor is stable, thereby variation in device performance (for example, the absolute value of the current amplification factor and the temperature coefficient of the current amplification factor, etc.) is reduced.

Fourth Embodiment

The phototransistors 10 and 11 according to the above embodiments are installed in semiconductor devices.

Figure 7:
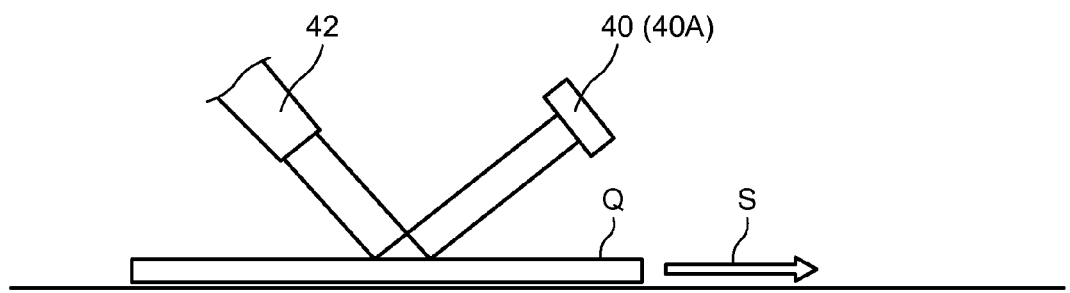
FIG. 7 is an explanatory diagram of a semiconductor device.

FIG. 7 is an explanatory diagram of a semiconductor device 40. The semiconductor device 40 includes the phototransistor 10 explained in the first embodiment. In an example illustrated in FIG. 7, the semiconductor device 40 is used for the measurement of flatness of a recording medium Q.

The semiconductor device 40 receives a reflected light of a light emitted from a light source 42 to the recording medium Q. The semiconductor device 40 is installed in a position where the light-receiving region R of the phototransistor 10 can receive the reflected light. As the light source 42, for example, a light-emitting diode (LED) is used.

In the semiconductor device 40, the light-receiving region R of the phototransistor 10 receives the reflected light from the recording medium Q to which the light has been emitted from the light source 42. Then, the phototransistor 10 outputs a photoelectric current according to the received light.

Here, the semiconductor device 40 outputs the photoelectric current output from the phototransistor 10 as a voltage.

Figure 8:
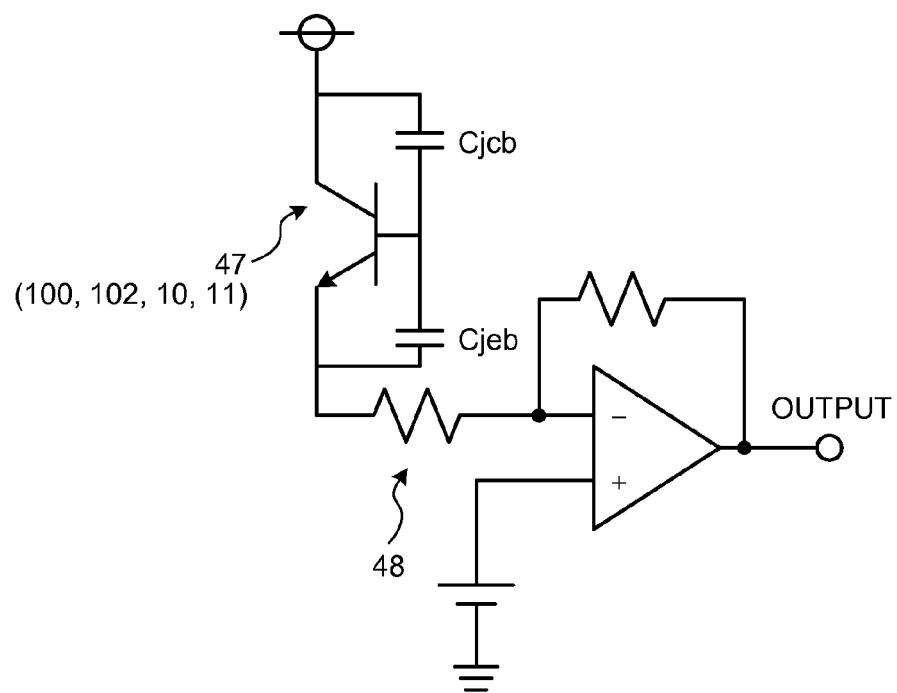
FIG. 8 is an explanatory diagram of a simple circuit of the semiconductor device.

FIG. 8 is an explanatory diagram of a simple circuit of the semiconductor device 40. As illustrated in FIG. 8, the semiconductor device 40 converts a photoelectric current output from a phototransistor 47 into a voltage through a resistance 48, and outputs the voltage. As the phototransistor 47, the phototransistor 10 is used.

Here, in the conventional phototransistor 100 (see FIGS. 2A and 2B), there is a problem that the capacitance of emitter-base junction between the first emitter regions 12 and the first base region 14 is too high when a photoelectric current is converted into a voltage. Therefore, in a semiconductor device including the conventional phototransistor 100, there is a delay in the time from when a light is received till when a voltage according to a photoelectric current is output.

Figure 9:
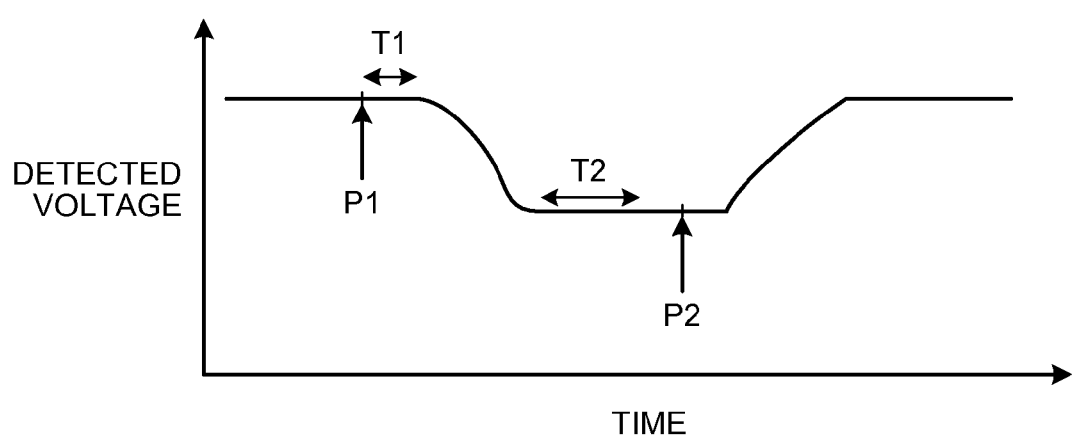
FIG. 9 is a line chart illustrating a relationship between time and detected voltage.

FIG. 9 is a line chart illustrating a relationship between time and detected voltage. FIG. 9 is a line chart illustrating a relationship between time and detected voltage when the conventional phototransistor 100 is installed in a conventional semiconductor device 40A (see FIG. 5). In FIG. 9, a recording medium Q is conveyed in a conveying direction S to a region irradiated with light from the light source 42. Then, FIG. 9 is a line chart showing a detected voltage when the conventional semiconductor device 40A has read a reflected light from the recording medium Q being conveyed.

As illustrated in FIG. 9, in the conventional semiconductor device 40A including the conventional phototransistor 100, there is a delay time T1 in the time from when a downstream-side end of the recording medium Q in the conveying direction S has reached the region irradiated with light from the light source 42 (see P1 in FIG. 9) until a voltage has been detected. In the semiconductor device 40, flatness of a recording medium Q is measured by repeatedly performing sampling in a period T2 in which output of detected voltage is stable. P2 in FIG. 7 indicates a point of time when an upstream-side end of the recording medium Q in the conveying direction S has passed through the region irradiated with light from the light source 42.

In general, when a phototransistor makes the transition from a dark state to an output state of outputting photoelectric current, base voltage varies. Therefore, in the conventional phototransistor 100, the parasitic capacitance of junction (Cjcb and Cjeb in FIG. 8) is increased, and the delay time T1 tends to increase. Furthermore, the lower the photoelectric current output from the conventional phototransistor 100 is, the higher the parasitic capacitance of junction is, and the more the delay time T1 tends to increase.

Incidentally, in the conventional phototransistor 102 (see FIGS. 3A and 3B), the first emitter regions 12 are arranged to be scattered on the first base region 14. Therefore, the conventional phototransistor 102 can reduce the delay time T1 as compared with the conventional phototransistor 100. However, in the conventional phototransistor 102, as described above, a difference in operation occurs between the end part and central part of the light-receiving region R.

Therefore, in the conventional semiconductor device 40A including a conventional phototransistor such as the conventional phototransistor 100 or the conventional phototransistor 102, it is not possible to accurately output photoelectric current.

On the other hand, the semiconductor device 40 according to the present embodiment includes the phototransistor 10 described in the above embodiment as a phototransistor, and therefore can reduce the delay time T1 and can output accurate photoelectric current.

Furthermore, also in the case where the semiconductor device 40 includes the phototransistor 11 instead of the phototransistor 10 as a phototransistor, the same effects can be obtained.

Practical Example

Subsequently, there is explained respective measurement results of photoelectric current output from the phototransistors 10 and 11 according to the first and second embodiments and the conventional phototransistor 102 (see FIGS. 3A and 3B).

Figure 10:
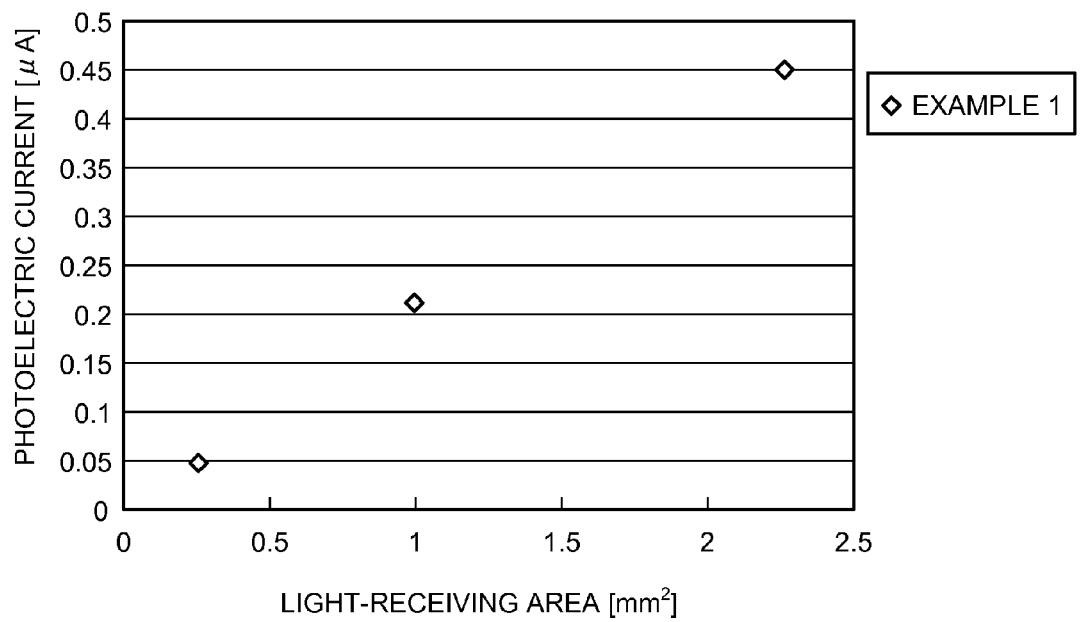
FIG. 10 is a line chart illustrating a relationship between light-receiving area of a light-receiving region R and output photoelectric current.
Figure 11:
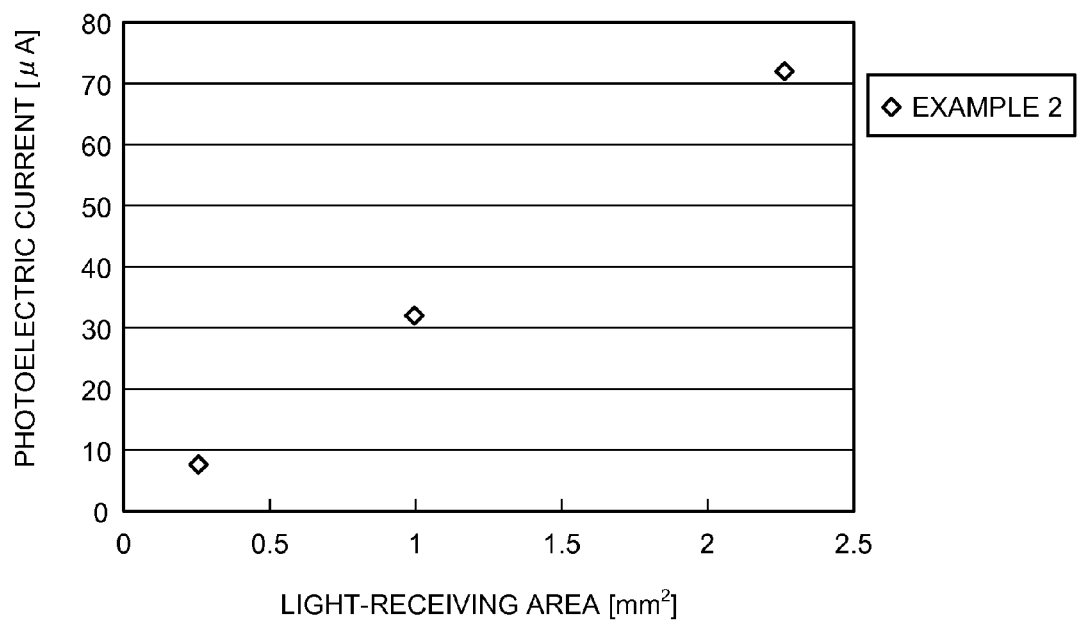
FIG. 11 is a line chart illustrating a relationship between light-receiving area of a light-receiving region R and output photoelectric current.
Figures 12, 13:
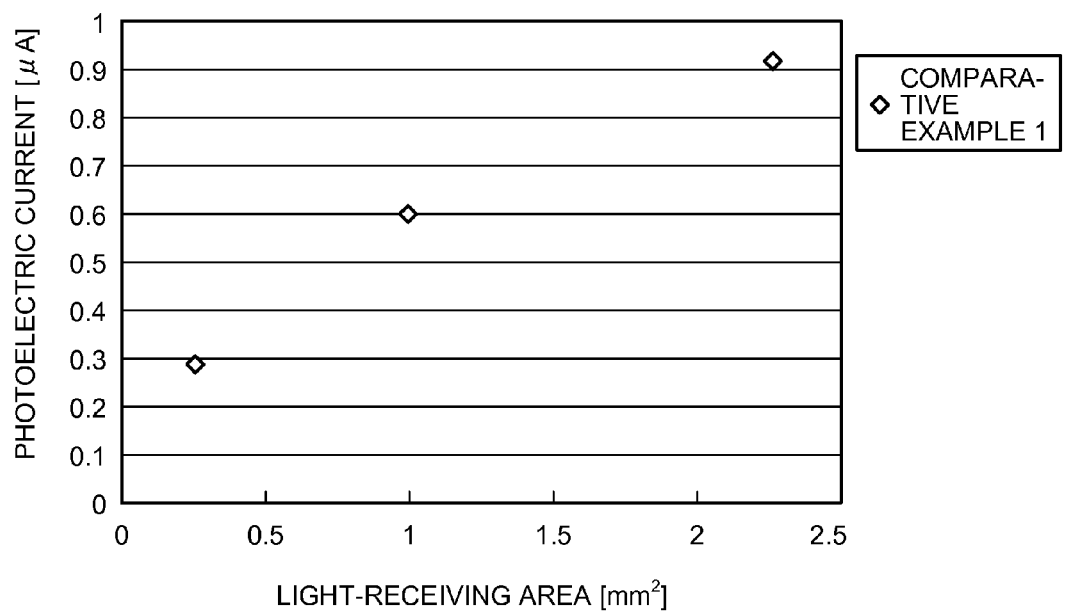
FIG. 12 is a line chart illustrating a relationship between light-receiving area of a light-receiving region R and output photoelectric current.
FIG. 13 is a table showing measurement results illustrated in FIGS. 10 to 12.

FIG. 10 is a line chart illustrating a relationship between light-receiving area ($mm^2$) of the light-receiving region R and output photoelectric current ($\mu A$) in the phototransistor 10 described in the first embodiment. FIG. 11 is a line chart showing a relationship between light-receiving area ($mm^2$) of the light-receiving region R and output photoelectric current ($\mu A$) in the phototransistor 11 described in the second embodiment. FIG. 12 is a line chart showing a relationship between light-receiving area ($mm^2$) of the light-receiving region R and output photoelectric current ($\mu A$) in the phototransistor 102 described with FIGS. 3A and 3B. FIG. 11 is a table showing measurement results illustrated in FIGS. 10 to 12. In FIG. 11, Example 1 shows a measurement result of the phototransistor 10; Example 2 shows a measurement result of the phototransistor 11; Example 1 shows a measurement result of the phototransistor 10; Comparative Example 1 shows a measurement result of the conventional phototransistor 102.

The light-receiving area indicates the total area of a portion of the first base region 14 exposed to the light-receiving side L through the first emitter regions 12.

The phototransistor 10 used in the measurement was manufactured by the following manufacturing method.

Specifically, there was prepared a silicon substrate that a phosphorus-doped epitaxial layer with 20 Ω·cm was grown by about 20 Ω·cm on an arsenic-doped low-resistance silicon substrate with 6 Ω·cm. Diffusion of the first base region 14 was formed on this substrate by doping a boron impurity so that the surface impurity concentration of the exposed surface is about $1 \times 10^{18}$ cm$^{-3}$, and the diffusion depth is about 2.0 μm. Furthermore, in the present case example, the first region 18 is the same diffusion as the first base region 14. The first emitter regions 12 were formed by doping a phosphorus impurity so that the surface impurity concentration is about $1 \times 10^{20}$ cm$^{-3}$, and the diffusion depth is about 0.3 μm.

Furthermore, the phototransistor 11 used in the measurement was manufactured by adding the first emitter regions 12 into the first region 18 in the manufacturing method of the phototransistor 10.

Moreover, the conventional phototransistor 102 used in the measurement was manufactured by using the same manufacturing method of the phototransistor 10 except for no first region 18 provided.

Furthermore, 5 V voltage was applied to the collector contact region 20, and the whole area of the light-receiving region R was irradiated with uniform halogen light with a light-receiving surface illuminance of 8 Lux/cm$^2$. Then, a photoelectric current output after one second from the start of the irradiation was measured as a photoelectric current corresponding to a sensor light-receiving area.

As illustrated in FIGS. 10 and 13, in the phototransistor 10, an R-2 value of an approximate curve showing a relationship between light-receiving area and photoelectric current was 0.998, and the approximate curve was an approximately-straight line. Furthermore, as illustrated in FIGS. 11 and 13, in the phototransistor 11, an R-2 value of an approximate curve showing a relationship between light-receiving area and photoelectric current was 1, and the approximate curve was a straight line.

That is, in the phototransistors 10 and 11 described in the above embodiments, output photoelectric current was increased in proportion to increase in light-receiving area.

Therefore, it can be said that in the phototransistors 10 and 11 described in the above embodiments, the uniform operation is performed over the whole surface of the light-receiving region R. Therefore, in the phototransistors 10 and 11 described in the above embodiments, even when a light was received by only a part of the light-receiving region R or a different part of the light-receiving region R, we confirmed that accurate photoelectric current was output.

On the other hand, as illustrated in FIGS. 12 and 13, in the conventional phototransistor 102, an R-2 value of an approximate curve showing a relationship between light-receiving area and photoelectric current was 0.979, and the approximate curve was a quadratic curve. That is, in the conventional phototransistor 102, when the light-receiving area was increased, output photoelectric current was saturated.

It can be thought that this is because in the conventional phototransistor 102, the operation of a bipolar transistor in the direction of arrow E (see FIGS. 3A and 3B) caused by the first emitter regions 12, the first base region 14, and the collector contact region 20 is given priority over the operation of a vertical bipolar phototransistor caused by the first emitter regions 12, the first base region 14, and the first collector region 25.

Furthermore, it can be thought that the saturated state was caused because the operation of the central part of the first base region 14 on the surface on the light-receiving side L is weaker than the operation of the end part of the first base region 14.

In this manner, we confirmed that the conventional phototransistor 102 cannot output accurate photoelectric current as compared with the phototransistors 10 and 11 according to the above embodiments.

According to the embodiments described above, it is possible to output accurate photoelectric current.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A phototransistor comprising a first emitter region, a first base region having at least a portion exposed to a light-receiving side, and a first collector region in this order from the light-receiving side in a depth direction, wherein
    the first collector region includes a second collector region and a third collector region that is in contact with a downstream side of the second collector region in the depth direction and has a resistance lower than that of the second collector region,
    the phototransistor further comprises a first region that is spaced away from the first base region at an outer side of the first base region on a light-receiving side surface thereof, the first region having a conductivity type opposite to that of the first collector region, and
    the first region is grounded, and wherein
    the phototransistor further comprises a collector contact region at an outer side of the first region on the light-receiving side surface thereof, the collector contact region being electrically connected to the first collector region, and wherein
    a depletion layer is formed between the first region and the collector contact region.

2. The phototransistor according to claim 1, wherein the first region is spaced away from the first base region at the outer side of the first base region on the light-receiving side surface so as to surround the first base region.

3. The phototransistor according to claim 1, wherein the first base region and the first region are electrically separated from each other.

4. The phototransistor according to claim 1, further comprising a plurality of first emitter regions that are spaced at intervals within the first base region on the light-receiving side surface of the phototransistor.

5. The phototransistor according to claim 1, wherein the first region is spaced away from the first base region at the outer side of the first base region on the light-receiving side surface so as to surround the first base region, and the first base region and the first region are electrically separated from each other.

6. The phototransistor according to claim 1 further comprising a plurality of first emitter regions, wherein the first region is spaced away from the first base region at the outer side of the first base region on the light-receiving side surface so as to surround the first base region, and the plurality of first emitter regions are spaced at intervals within the first base region on the light-receiving side surface of the phototransistor.

7. The phototransistor according to claim 1 further comprising a plurality of first emitter regions, wherein the first base region and the first region are electrically separated from each other, and the plurality of first emitter regions are spaced at intervals within the first base region on the light-receiving side surface of the phototransistor.

8. The phototransistor according to claim 1 further comprising a plurality of first emitter regions, wherein the plurality of first emitter regions are spaced at intervals within the first base region on the light-receiving side surface of the phototransistor.

9. The phototransistor according to claim 1 further comprising a plurality of first emitter regions, wherein the first region is spaced away from the first base region at the outer side of the first base region on the light-receiving side surface so as to surround the first base region, the first base region and the first region are electrically separated from each other, and the plurality of first emitter regions are spaced at intervals within the first base region on the light-receiving side surface of the phototransistor.

10. A semiconductor device comprising the phototransistor according to claim 1.

* * * * *